United States Patent [19]
Beck et al.

[11] 3,960,605

[45] June 1, 1976

[54] METHOD OF IMPLANTATION OF BORON IONS UTILIZING A BORON OXIDE ION SOURCE

[75] Inventors: Siegfried Beck; Karl Brack; Peter Gansauge, all of Boeblingen, Germany

[73] Assignee: International Business Machines Corporation, Armonk, N.Y.

[22] Filed: Jan. 23, 1975

[21] Appl. No.: 543,214

[52] U.S. Cl.................................. 148/1.5; 148/188; 148/189; 357/91
[51] Int. Cl.².......................................... H01L 21/265
[58] Field of Search................... 148/1.5, 188, 189; 357/91

[56] References Cited
UNITED STATES PATENTS

| | | | |
|---|---|---|---|
| 2,842,466 | 7/1958 | Moyer | 148/1.5 |
| 3,477,887 | 11/1969 | Ehlenberger | 148/189 |
| 3,498,853 | 3/1970 | Dathe et al. | 148/189 X |
| 3,563,809 | 2/1971 | Wilson | 148/1.5 |

FOREIGN PATENTS OR APPLICATIONS 1,093.822   12/1967   United Kingdom.................. 148/1.5

OTHER PUBLICATIONS

Fränz et al. "Conversion of Silicon Nitride into Silicon Oxide-etc." Solid State Electronics, vol. 14 (1971), pp. 499–503.

*Primary Examiner*—L. Dewayne Rutledge
*Assistant Examiner*—J. M. Davis
*Attorney, Agent, or Firm*—J. B. Kraft

[57] ABSTRACT

A method of ion implantation, in which boron ions are generated by introducing a boron-oxide containing material vapor into a conventional gas discharge ion generation source.

12 Claims, No Drawings

METHOD OF IMPLANTATION OF BORON IONS UTILIZING A BORON OXIDE ION SOURCE

BACKGROUND OF INVENTION

The invention relates to a method of ion implantation with an ion source material for generating boron ions.

As in semiconductor technology the demand for microminiaturization and ever closer tolerances at very small dimensions is increasing, so is the method of ion implantation, in particular for doping semiconductor materials, gaining in importance. With the ion implantation method, ions of an accurately defined energy are injected into the semiconductor material, whereby it is possible to predetermine equally accurately the depth of penetration of the injected ion and the lateral expansion of the area to be doped. In addition, this method, in comparison with the previously employed diffusion methods, permits the doping profile to be influenced almost arbitrarily.

With the ion sources generally employed the ions used for implantation are generated by a gas discharge into which the ion source material is injected in a gaseous form. For p conductivity generation, semiconductor technology generally employs boron doping. Known ion source materials for generating boron ions are boron halides, in particular boron fluroide, boron chloride, and boron bromide. These compounds which are gaseous and highly volatile permit the generation of ion currents, as are required for an economical, i.e., an ion implantation under manufacturing conditions.

The Sidenius type ion source, which is described in detail further on and which is distributed by the Danfysik company under the name "High-Temperature, Hollow-Cathode, Ion Source", modified Type 911, for example, in conjunction with boron halides as an ion source material, permits generating ion currents of the order of 40 microamps. On the other hand, however, boron halides are extremely poisonous. During their decomposition, as, for example, in gas discharges, the highly corrosive halogens are freed, resulting in the ion source and other apparatus parts, such as pumping equipment, being destroyed. For these reasons the use of boron halides as ion source material is subject to very strict safety regulations. Therefore, attempts have been made to find boron ion source materials which are non-poisonous and which generate only a minimum quantity of corrosive decomposition products. Elementary boron is a boron ion source material fitting this description. With elementary boron, the boron is heated in an oven connected to the ion source. However, even at the maximum temperatures, about 1500° C, to which conventional ovens may be subjected, the ion currents yielded by the above-mentioned ion source, using boron as boron ion source material, are only of the order of 1 microamp. This would mean that an ion implantation process taking, for example, 1 minute, using boron halides as boron ion source material would last 30 to 40 minutes with boron as boron ion source material. As implantation times of such length are both unacceptable and uneconomical, elementary boron, in spite of its otherwise favorable characteristics as boron ion source material, is impracticable for manufactural applications.

SUMMARY OF THE PRESENT INVENTION

It is the object of the invention to provide a method of ion implantation with boron ion source material which is non-poisonous, forms a minimum quantity of corrosive decomposition products and which permits ion currents being reproduced over a longer period of time, whereby the magnitude of the ion currents is such that they suit the requirements of a manufacturing process aimed at a high throughput and high yields.

To this end, a method of ion implantation is provided with a source material which contains boron oxide as an evaporating substance and which, unless commercially available as boron oxide, can be produced to one of the methods described further on. Boron oxide is non-poisonous, it forms decomposition products which are slightly corrosive at high temperatures only, it has an unlimited life at room temperature and in a $10^{-2}$ Torr vacuum at temperatures from about 500° C onward is volatile to such an extent that it permits the generation of ion currents of magnitudes suitable for productional applications, whereby for producing ion currents of a still higher magnitude the temperature has to be increased accordingly.

It is advantageous for the ion source material to consist of a material which is obtained by oxidizing a solid boron-bearing material.

An advantageous ion source material containing boron oxide is obtained, for example, from boron-bearing material taking the form of boron nitride. When using this ion source material, which is hereafter referred to as oxidized boron nitride, it is not necessary, as with solid ion source materials, to take precautions against a part of the evaporating material depositing itself on the colder parts of the apparatus used. This advantage is not obtained at the expense of reduced magnitude ion currents.

It surprisingly emerged that the ion currents generated are not reduced in their magnitude even if the boron nitride is not fully oxidized but contains only 25 to 75 per cent by weight of boron oxide. This is particularly desirable, since the oxidation speed decreases as oxidation progresses.

It is advantageous for the ion source material to contain $SiO_2$ as an additional component. The addition of this substance, for example, to boron nitride, facilitates its application. Apart from this, a sinter product, consisting of boron nitride and $SiO_2$ and which is free from detrimental impurities, is commercially available. The characteristics of the ion source material are not negatively affected by the addition of $SiO_2$. On the contrary, its characteristics are even improved, since the boron oxide at temperatures below 1000° C evaporates continuously and not too rapidly from the boron silicate glass, which in turn ensures a stable operation of the ion source under constant conditions over long periods of time. In addition, the boron silicate glass retains its stability even after prolonged shelf life.

An ion source material containing boron silicate glass of this kind is advantageously generated also when the solid boron-bearing oxidized material consists of boron-doped silicon.

The life of the standard tungsten filament required for the conventional gas discharge equipment is advantageously prolonged by admixing elementary boron to the ion source material. This does not result in a reduction of the ion current, provided the percentage of elementary boron in the ion source material stays below a value of 50.

A further advantage is inherent in the fact that the boron nitride can be readily oxidized without extensive equipment. To this end boron nitride particles are used, whose diameters are between about 1 and 3 mm. These particles are exposed for a predetermined time at a temperature of between 900° to 1100° C to an oxygen flow, to be subsequently subjected for yet another predetermined time to a nitrogen flow for stabilization. At temperatures above 1100° C a considerable quantity of the boron oxide formed would volatilize. At temperatures below 900° C oxidation would proceed too slowly.

During the oxidation of a sinter product consisting of boron nitride and $SiO_2$ for the purpose of generating an ion source material with 50 per cent by weight of boron oxide, as referred to the oxidized boron nitride, it was found advantageous for the initial product to be crushed to a particle size of between 1 and 3 mm, to be subsequently heated in oxygen at 1000° C for 45 minutes, followed by a 45-minute treatment period in nitrogen.

Boron ion source material can be advantageously produced by crushing boron-doped silicon wafers down to a particle size of between about 1 and 3 mm and by subsequently oxidizing the particles at a temperature ranging from 900° to 1100° C.

The foregoing and other objects, features and advantages of the invention will be apparent from the following more particular description and preferred embodiments of the invention.

DESCRIPTION OF PREFERRED EMBODIMENTS

As boron oxide is a material that remains solid at room temperature, it has to be initially heated in an oven connected to the gas discharge space, in order to cause a sufficient quantity of boron oxide to evaporate, so that the gas discharge space contains a sufficient quantity of boron oxide for the ion currents required. When using commercially available boron oxide, it is necessary to prevent the evaporating boron oxide from depositing itself on the colder apparatus parts. Precautionary measures which prevent this include, for example, an accurate control of the evaporation process, an ion source for the gas discharge which is specifically tailored to the source material and, if necessary, a heat treatment of critical components.

It surprisingly emerged that even without the above-mentioned precautions boron oxide does not deposit itself on the apparatus parts when the commercially available boron oxide is replaced by an ion source material which is generated by solid boron-bearing materials, such as boron nitride, being converted into boron oxide by more or less total oxidation. The reason for the characteristics of the boron oxide thus obtained being more favorable is not known. It is possible though that the boron oxide formed during the oxidation of boron nitride has a modification other than that of commercially available boron oxide, whereby the two modifications differ by their behaviour during evaporation or the fully oxidized boron nitride at the end of oxidation still contains at least traces of boron nitride which favorably influence the evaporation of the boron oxide.

It also emerged that it is not necessary for the boron nitride to be fully converted into boron oxide, in order to obtain an ion source material permitting an adequate ion current to be generated. Very satisfactor results were obtained, for example, from an ion source material containing 50 per cent by weight of boron oxide. The serviceability of partly oxidized boron nitride is highly advantageous, since oxidation during the generation of the boron oxide decelerates progressively. The reason for this is that at the beginning of oxidation the boron nitride particles cover themselves with a boron oxide coating through which the oxygen has to diffuse to contact the non-reacted boron nitride. Naturally, the diffusion and thus the reaction speed decrease the thicker the oxide film surrounding the boron nitride particles becomes.

It has proved favorable to use a wafer type commercially available material as boron nitride source. This material consists of boron nitride and $SiO_2$, whereby the maximum quantity of $SiO_2$ present is 60 per cent by weight. The said material has the advantage that the form in which it is present both before and after oxidation permits ready handling. In addition, it contains both the boron nitride and the $SiO_2$ in a highly pure form. By means of the boron oxide generated during the oxidation of the boron nitride, the $SiO_2$ forms a boron silicate glass, whose favorable characteristics were described above.

For oxidation, the wafers consisting of boron nitride and $SiO_2$ are initially crushed in such a manner that particles having a diameter ranging from about 1 to 3 mm are obtained. Subsequently, the crushed material is heated in an oxygen flow for oxidation for a period of 45 minutes at 1000° C, followed by a 45-minute heating period at 1000° C in a nitrogen flow for stabilization. The product yielded by this method contains about 50 per cent of boron oxide, as referred to the oxidized boron nitride. Oxidation and stabilization do not necessarily have to be carried out at 1000° C. Satisfactory results are also obtained in 1100°range between 900° and 110° C if the process times are adapted to the temperatures. As previously mentioned, considerable quantities of boron oxide evaporate at temperatures above 1100° C. Apart from this, the decomposition of the boron nitride reaches uncontrollable proportions above 1200° C. At temperatures below 900° C long process times which are unacceptable for manufactural applications have to be put up with.

As previously mentioned, an ion source material containing boron silicate glass can also be generated by oxidizing boron doped silicon wafers, whereby boron and silicon are oxidized.

In connection with the examples of application for the inventive ion source material described below, ion implantation was carried out by means of an ion source originally developed by G. Sidenius and distributed by the Danfysik company under the trade name "High-Temperature, Hollow-Cathode Ion Source", modified type 911. The ion source essentially consists of the discharge chamber and a directly heated oven which is charged with solid substances containing the material to be ionized. The discharge chamber is made up of a concentrically wound tungsten filament forming the cathode and serving for electrode emission. It also comprises a positively charged anode ring of tungsten with a central bore which is used as an inlet aperture for the source material evaporated in the oven. In the discharge space between cathode and anode ions are formed when electrons having a current strength of up to 5 amps. are emitted from the cathode, i.e., the tungsten filament. To obtain a stationary plasm consisting of ions and electrons, a gas pressure of $10^{-3}$ to $10^{-2}$ Torr is required. The oven which is used to develop this vapor pressure has a temperature of between 800° and 1000° C for the ion source materials described in this application. The oven is connected to an argon source.

At the beginning of ion implantation argon flows through the oven into the discharge chamber, being sucked from the latter at a rate that results in the generation of a gas pressure ranging from $10^{-3}$ to $10^{-2}$ Torr. This pressure is necessary for igniting the gas discharge. If subseqently so much ion source material is evaporated that a partial pressure of at least $10^{-2}$ Torr is formed in the discharge chamber, the argon flow is cut off, and the gas discharge is subsequently maintained by means of the evaporating ion source material.

The discharge chamber on the cathode side is linked to a tungsten plate having a narrow central bore of about 0.5 mm diameter. The diameter of this bore is essential to the maintenance of the desired gas pressure within the discharge chamber. Through this bore the ions are extracted from the ion plasma by means of a highly negatively charged electrode, connected to a potential of a least 10,000 V, and are subsequently fed to the acceleration path and the analyzing magnet, respectively.

When used in connection with the above-mentioned oxidized material of boron nitride and $SiO_2$, the cathode tungsten filament has a life of about 3 to 5 hours, which is sufficient for a satisfactory production method. It is obvious, however, that it would be more favorable if the production process had to be interrupted for the insertion of a new filament only at the end of a shift, i.e., every eight hours, rather than every 3 to 5 hours. Surprisingly, it was found that it is possible to increase the life of the tungsten filament to 8 or 10 hours by admixing an additional component in the form of an elementary boron powder to the ion source materials described above.

The invention will be described in detail below by means of four embodiments or examples.

For three out of the four examples the wafers consisting of boron nitride and $SiO_2$ were used in a crushed, oxidized and stabilized form, whereby the boron oxide content, as referred to the oxidized boron nitride, amounted to 50 per cent by weight. With two examples, the ion source material contained as an additional component elementary boron in differing quantities. In the case of the fourth example, pulverized elementary boron was used as ion source material to show the actual difference between this and the other examples.

The table given below is a breakdown of the volume ratios of the elementary boron to oxidized BN material and the ion currents obtained by means of the ion source materials thus composed, using at oven temperatures from 800 to 1000° C the modified type 911 ion source distributed by the Danfysik company.

TABLE

| Example No. | Volume Ratio Boron : Oxidized BN Material | Ion Current Microamp. |
| --- | --- | --- |
| 1 | 0 : 1 | 30 – 40 |
| 2 | 1 : 1 | 30 – 40 |
| 3 | 10 : 1 | 20 – 30 |
| 4 | 1 : 0 | 1 |

The examples show that the ion source material in accordance with the invention ensures an ion current that is 40 times higher than that obtained from an elementary boron ion source material and that the elementary boron admixed to the oxidized BN material does not reduce the effect of the ion source material if it amounts to 50 per cent by volume or less.

The ion currents obtained in Examples 1 to 3 are comparable to those measured during the use of boron halides as ion source material.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In an ion implantation process comprising
   vaporizing a material comprising boron oxide,
   introducing the resulting vapor into a gas discharge ion generation source,
   extracting and separating boron ions generated by said source, and
   injecting said boron ions into a semiconductor substrate.
2. The process of claim 1 wherein said material is oxidized boron nitride.
3. The process of claim 2 wherein said oxidized boron nitride comprises between 25 and 75 per cent by weight of boron oxide.
4. The process of claim 1 wherein said material is oxidized boron doped silicon.
5. The process of claim 1 wherein said material further includes silicon dioxide.
6. The process of claim 2 wherein said material further includes silicon dioxide.
7. The process of claim 1 wherein said material further includes elemental boron.
8. The process of claim 7 wherein the elemental boron content of said material is up to 50 per cent by volume.
9. The process of claim 1 wherein said boron oxide is formed by thermal oxidation.
10. The method of claim 2 wherein the boron nitride to be oxided is in the form of boron nitride particles having a diameter ranging from 1 to about 3 mm, and the particles are heated at 900° to 1100° C initially in an oxygen flow and subsequently in a nitrogen flow.
11. The process of claim 1 wherein said material is prepared by fragmenting a mixture of boron nitride and $SiO_2$ to a particle size between 1 and 3 mm, and heating said mixture at 1000° C initially for 45 minutes in an oxygen flow, followed by 45 minutes in a nitrogen flow.
12. The process of claim 4 wherein the oxidation of said boron doped silicon is achieved by fragmenting the boron doped silicon to a particle size between 1 and 3 mm and oxidizing the particles at 900° to 1100° C.

* * * * *

UNITED STATES PATENT OFFICE
CERTIFICATE OF CORRECTION

PATENT NO. : 3,960,605
DATED : June 1, 1976
INVENTOR(S) : Siegfried Beck, Karl Brack and Peter Gansauge It is certified that error appears in the above-identified patent and that said Letters Patent are hereby corrected as shown below:

On the title page, include the following data:

Foreign Application Priority Data

February 23, 1974    Germany.........P2408829.7

Signed and Sealed this

Fifth Day of October 1976

[SEAL]

Attest:

RUTH C. MASON
Attesting Officer

C. MARSHALL DANN
Commissioner of Patents and Trademarks